United States Patent
Chen et al.

(10) Patent No.: US 8,278,166 B2
(45) Date of Patent: Oct. 2, 2012

(54) METHOD OF MANUFACTURING COMPLEMENTARY METAL OXIDE SEMICONDUCTOR DEVICE

(75) Inventors: Chun-Chia Chen, Taichung County (TW); Ying-Hung Chou, Tainan County (TW); Zen-Jay Tsai, Tainan (TW); Shih-Chieh Hsu, Taipei County (TW); Yi-Chung Sheng, Tainan (TW); Chi-Horn Pai, Tainan County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 110 days.

(21) Appl. No.: 12/837,519

(22) Filed: Jul. 16, 2010

(65) Prior Publication Data

US 2012/0012938 A1    Jan. 19, 2012

(51) Int. Cl.
*H01L 21/8238* (2006.01)
(52) U.S. Cl. .............. 438/199; 438/231; 257/369
(58) Field of Classification Search ............ 438/199, 438/231; 257/369, E21.634, E27.062
See application file for complete search history.

(56) References Cited

U.S. PATENT DOCUMENTS

| | | | |
|---|---|---|---|
| 6,165,826 A * | 12/2000 | Chau et al. | 438/231 |
| 6,864,135 B2 | 3/2005 | Grudowski et al. | |
| 7,112,495 B2 | 9/2006 | Ko et al. | |
| 7,148,548 B2 | 12/2006 | Doczy et al. | |
| 7,390,707 B2 * | 6/2008 | Kawamura et al. | 438/197 |
| 7,491,615 B2 | 2/2009 | Wu et al. | |
| 7,618,856 B2 | 11/2009 | Ting et al. | |
| 7,799,630 B2 | 9/2010 | Yu et al. | |
| 7,994,015 B2 * | 8/2011 | Thirupapuliyur et al. | 438/303 |
| 8,043,919 B2 | 10/2011 | Chen et al. | |
| 2005/0095798 A1 | 5/2005 | Cheng et al. | |
| 2007/0138559 A1 | 6/2007 | Bohr | |
| 2009/0186475 A1 | 7/2009 | Ting et al. | |

* cited by examiner

*Primary Examiner* — Theresa T Doan
(74) *Attorney, Agent, or Firm* — Winston Hsu; Scott Margo

(57) ABSTRACT

A method of manufacturing a CMOS device includes providing a substrate having a first region and a second region; forming a first gate structure and a second gate structure, each of the gate structures comprising a sacrificial layer and a hard mask layer; forming a patterned first protecting layer covering the first region and a first spacer on sidewalls of the second gate structure; performing an etching process to form first recesses in the substrate; performing a SEG process to form epitaxial silicon layers in each first recess; forming a patterned second protecting layer covering the second region; and performing a dry etching process with the patterned second protecting layer serving as an etching mask to etch back the patterned first protecting layer to form a second spacer on sidewalls of the first gate structure and to thin down the hard mask layer on the first gate structure.

12 Claims, 5 Drawing Sheets

METHOD OF MANUFACTURING COMPLEMENTARY METAL OXIDE SEMICONDUCTOR DEVICE

BACKGROUND OF THE INVENTION

1. Field of the Invention

The present invention relates to a method of manufacturing a complementary metal oxide semiconductor (CMOS) device, and more particularly, to a method of manufacturing a CMOS device with selective epitaxial growth (SEG) and metal gate.

2. Description of the Prior Art

As semiconductor processes advance to very deep submicron geometries and with the progress of device miniaturization, enhancing carrier mobility and driving current of a MOS transistor has become a critical issue. For example, manufacturing source/drain of a MOS transistor with selective epitaxial growth (SEG) technology is used to improve electrical performance of those elements.

Please refer to FIGS. 1-3, which are schematic drawings illustrating a conventional method of manufacturing a CMOS device. As shown in FIG. 1, a substrate 100 comprising an N-type well 102, a P-type well 104 and shallow trench isolations (STIs) 106 formed in between is provided. Gate structures 112 and 114 are respectively formed on the N-type well 102 and the P-type well 104 by etching a polysilicon layer 110 and a dielectric layer with a patterned SiN hard mask layer 108 serving as an etching mask. Then, a seal layer 120 is formed and followed by forming P-type lightly doped drains (P-LDDs) 122 and N-type LDDs (N-LDDs) 124 respectively in the N-type well 102 and the P-type well 104. After forming the P-LDDs 122 and N-LDDs 124, a SiN layer 130 is formed on the substrate 100.

Please refer to FIG. 2. The seal layer 120 and the SiN layer 130 are then patterned to form a SiN protecting layer 130a covering the P-type well 104 and a SiN first spacer 132 at sidewall of the gate structure 112. The SiN protecting layer 130a and the SiN first spacer 132 serve as an etching mask in a following etching process used to form recesses (not shown) respectively at two sides of the gate structure 112 in the N-type well 102. A selective epitaxial growth (SEG) process is performed to form epitaxial silicon layers 140 respectively in each recess. As shown in FIG. 2, it is noteworthy that while the SiN hard mask layer 108 covering the polysilicon layer 110 of the gate structure 112 is getting thinner due to consumption in the etching process, the hard mask layer 108 covering the polysilicon layer 110 of the gate structure 114 is protected from the consumption by the SiN protecting layer 130a. Consequently, there will be a height deviation A that is more than 250 angstroms (Å) between the hard mask layer 108 covering the gate structure 112 and the hard mask layer 108 covering the gate structure 114.

Please refer to FIG. 3. It is well-known to those skilled in the art that after forming the epitaxial silicon layer 140, a second spacer 150 is formed by sequentially forming an insulating layer (not shown) on the substrate 200 and etching the insulating layer, the SiN protecting layer 130a, and the first spacer 132. Thus the second spacer 150 is formed on the sidewalls of the gate structures 112 and 114. Then, sequentially forming a P-type source/drain 152 in the epitaxial silicon layer 140 and an N-type source/drain 154 in the substrate 100 at two sides of the gate structure 114. As shown in FIG. 3, because the second spacer 150 is formed after forming the epitaxial silicon layer 140, the second spacer 150 is to cover a portion of the epitaxial silicon layer 140. Then, a self-aligned silicide (salicide) process is performed to form salicide layers (not shown) on the P-type and N-type source/drains 152 and 154. Thus, a PMOS transistor 162 and an NMOS transistor 164 are obtained. After forming the salicide layers, an interlayer dielectric (ILD) layer (not shown) is formed to cover the PMOS and NMOS transistors 162 and 164.

In addition, since the conventional polysilicon gate has faced problems such as inferior performance due to boron penetration and unavoidable depletion effect which increases equivalent thickness of the gate dielectric layer, reduces gate capacitance, and worsens a driving force of the devices, metal gate approach is introduced to be the control electrode. Accordingly, a chemical-mechanical polishing (CMP) process is performed to remove the unnecessary ILD layer and the hard mask 108. Therefore the polysilicon layers 110 are following removed for forming metal gates that are used to replace the conventional polysilicon gate.

Please still refer to FIG. 3. It is noteworthy that the size of the second spacer 150 of the NMOS transistor 164 is larger than that of the PMOS transistor 162. Furthermore, a serious bottom footing defect as shown in circle B designated in FIG. 3 is always found in the second spacer 150 of the NMOS transistor 164 due to the height deviation A between the two gate structures 112 and 114. Such footing defect further adversely impacts profiles of the following formed N-type source/drain 154. Moreover, since the footing defect occupies a portion of the valuable surface of the source/drain 154, it is impossible to form the salicide layer on the surface covered by the second spacer 150. As the critical dimension (CD) keeps shrinking, the salicide layer missed on the surface of the source/drain 154 leads to an undesired raise of contact resistance (Rc). The height deviation A also causes adverse affect such as a seam obtained in the NMOS transistor 164 during forming the ILD layer, and complicates process control during performing the CMP process.

Therefore, a method of manufacturing a CMOS device is still needed to overcome the abovementioned problems.

SUMMARY OF THE INVENTION

According to an aspect of the present invention, there is provided a method of manufacturing a complementary metal oxide semiconductor (CMOS) device. The method of manufacturing a CMOS device comprises steps of providing a substrate having a first region and a second region defined thereon; forming a first gate structure and a second gate structure respectively in the first region and the second region, each of the gate structures comprising a gate dielectric layer, a sacrificial layer, and a hard mask layer; forming a patterned first protecting layer covering the first region and a first spacer on sidewalls of the second gate structure; performing an etching process to form first recesses in the substrate at two sides of the second gate structure; performing a selective epitaxial growth (SEG) process to form epitaxial silicon layers in each first recess; forming a patterned second protecting layer covering the second region with a first photomask; and performing a dry etching process with the patterned second protecting layer serving as an etching mask to etch back the patterned first protecting layer to form a second spacer on sidewalls of the first gate structure and thin down the hard mask layer on the first gate structure.

According to another aspect of the present invention, there is provided a CMOS device. The CMOS device comprising a substrate having a first region and a second region defined thereon, a first type MOS transistor formed on the first region and a second type MOS transistor formed on the second region. The first type MOS transistor further comprises a first type gate formed on the substrate, a first type LDDs formed in the substrate, a first type source/drain formed in the substrate, and a first spacer formed on sidewalls of the first type gate. The second type MOS transistor further comprises a second type gate formed on the substrate, second type LDDs formed in the substrate, epitaxial silicon layers formed in the substrate, and a second spacer identical to the first spacer formed on sidewalls of the second type gate.

According to the method of manufacturing a CMOS device provided by the present invention, the hard mask layer is thinned down after the SEG process, therefore no height deviation occurs between the two transistors. Consequently, the adverse impacts to the spacer and source/drain profiles and to the following ILD layer formation and planarization process are all prevented.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
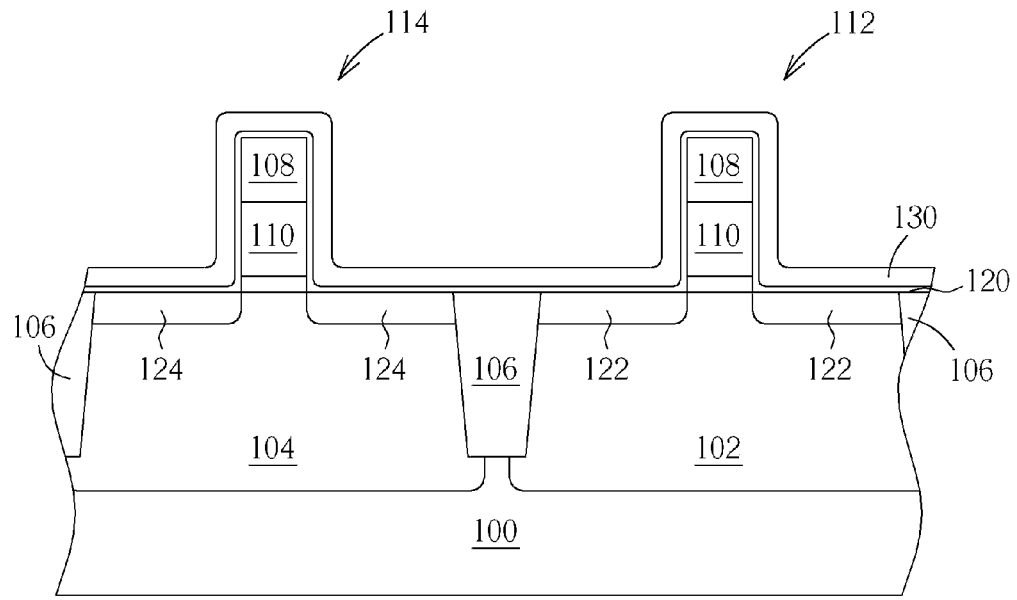
FIGS. 1-3 are schematic drawings illustrating a conventional method of manufacturing a CMOS device.
Figure 2:
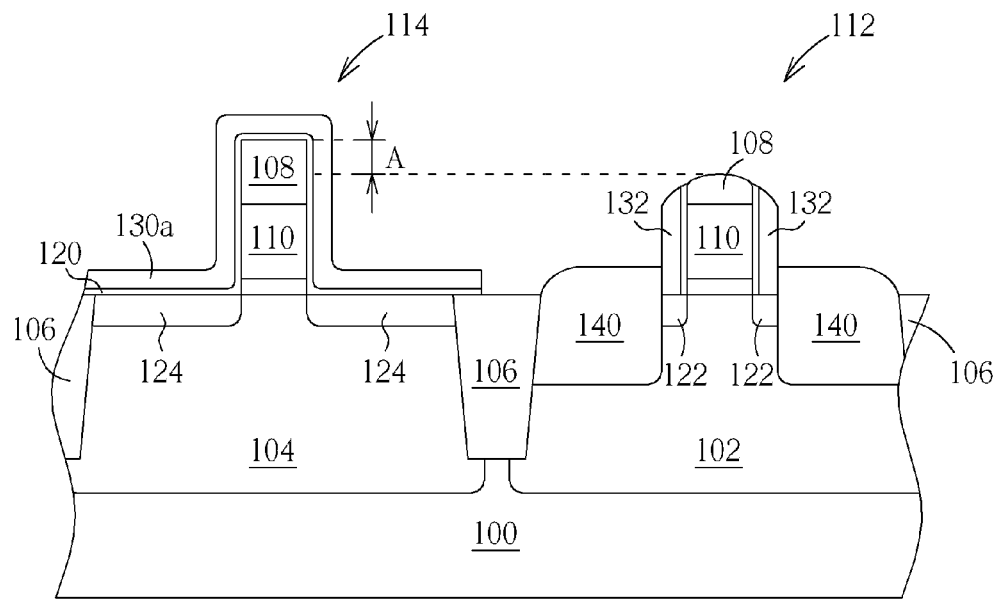
Figure 3:
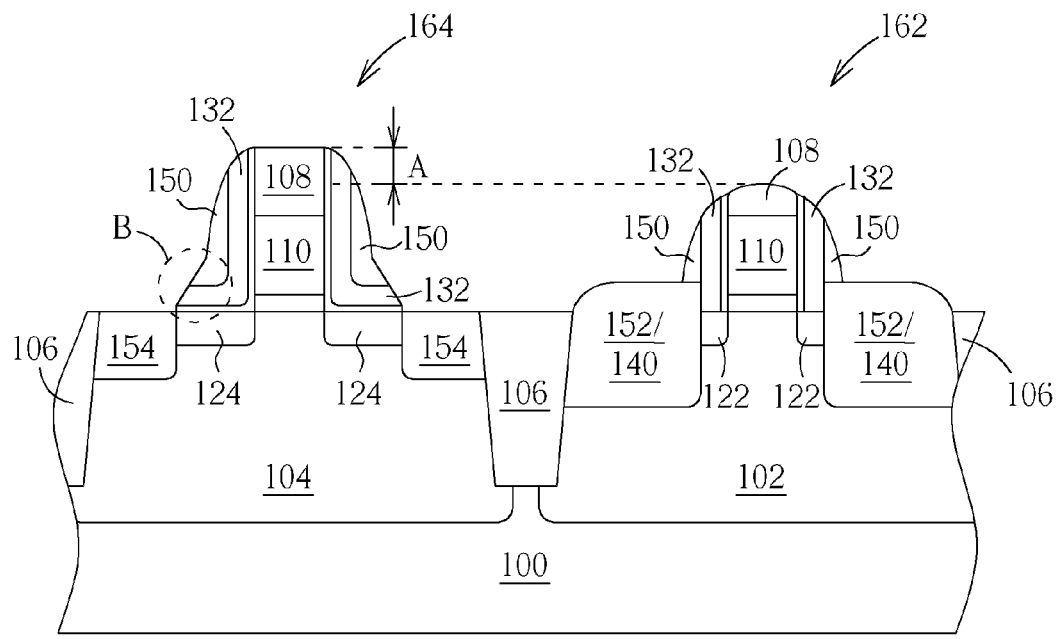
Figure 4:
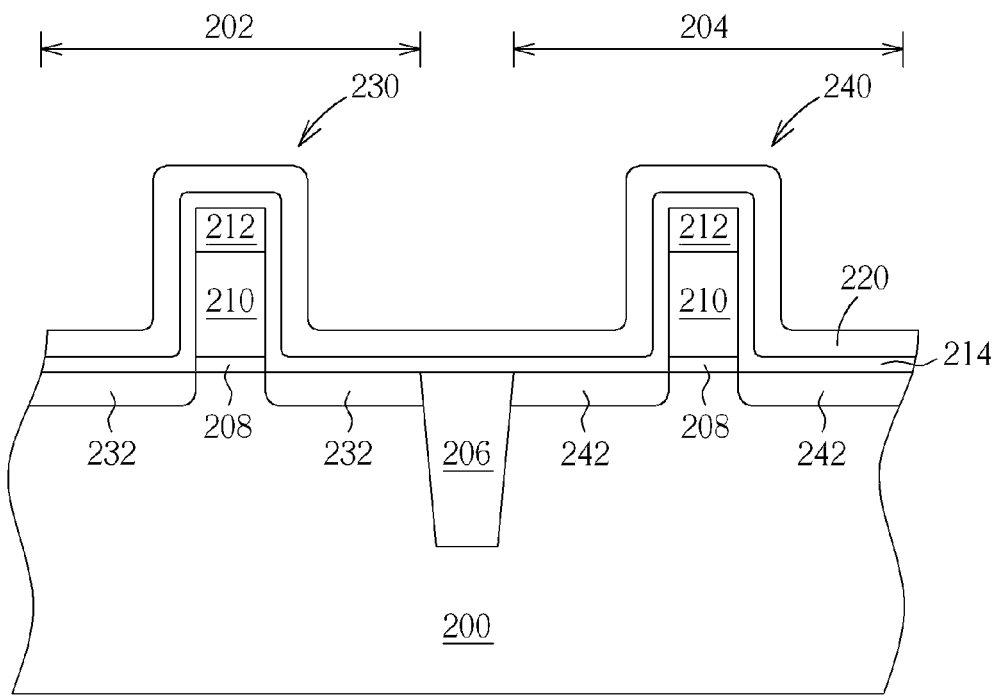
FIGS. 4-10 are schematic drawings illustrating a method of manufacturing a CMOS device according to a preferred embodiment provided by the present invention.

Please refer to FIGS. 4-10, which are schematic drawings illustrating a method of manufacturing a CMOS device according to a preferred embodiment provided by the present invention. As shown in FIG. 4, a substrate 200 having a first region 202 and a second region 204 defined thereon is provided. The substrate 200 also includes at least a shallow trench isolation (STI) 206 used to provide electrical isolation formed in between the first region 202 and the second region 204. Next, forming a first gate structure 230 and a second gate structure 240 respectively in the first region 202 and the second region 204. Each gate structure 230 and 240 comprises a gate dielectric layer 208, a sacrificial layer 210 preferably a polysilicon layer, and a hard mask layer 212. The hard mask layer 212 comprises silicon oxide ($SiO_2$), silicon nitride (SiN), silicon oxynitride (SiON), silicon carbon nitride (SiCN), silicon carbide (SiC), silicon oxycarbide (SiOC), or silicon-rich-nitride (SRN).

Please still refer to FIG. 4. Then, a seal layer 214 is formed covering the first gate structure 230 and the second gate structure 240 on the substrate 200, and followed by performing conventional lightly doped drain (LDD) implantation processes. Accordingly, first type LDDs 232 are formed in the substrate 200 respectively at two sides of the first gate structure 230 and second type LDDs 242 are formed in the substrate 200 respectively at two sides of the second gate structure. In this preferred embodiment, the first type is exemplarily the N-type and the second type is exemplarily the P-type. However, it is not limited to have the first type being the P-type and the second type being the N-type. Then, a first protecting layer 220 is formed on the substrate 200. The first protecting layer 220 comprises material the same with the hard mask layer 212, therefore those materials are omitted herein in the interest of brevity. The first protecting layer 220 also can be a bi-layer comprising silicon oxide and silicon nitride.

Figure 5:
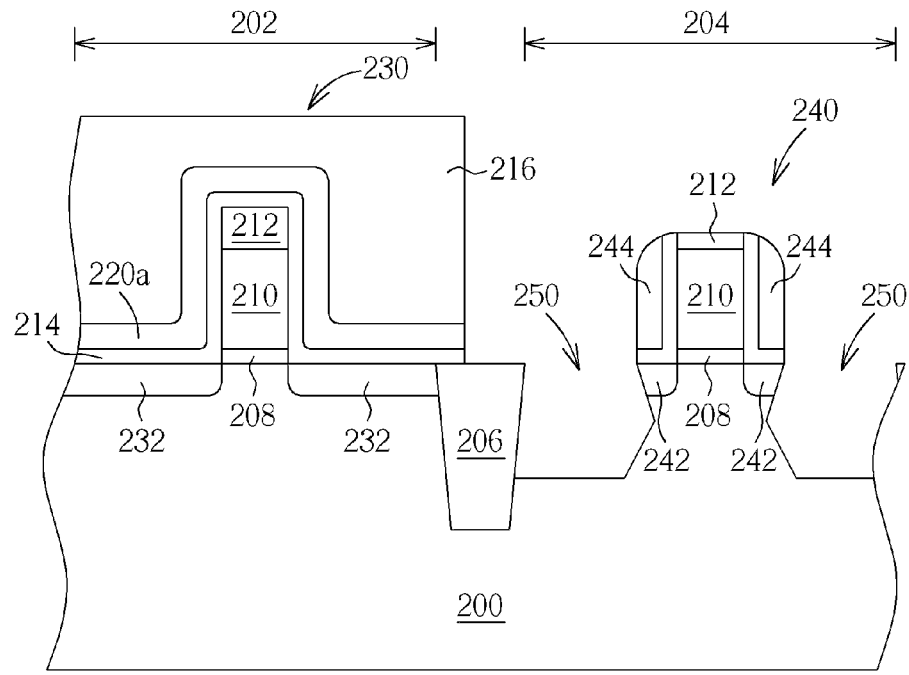

Please refer to FIG. 5. Next, a patterned photoresist layer 216 is formed on the substrate 200 and followed by patterning the first protecting layer 220. Thus, a patterned first protecting layer 220a covering the first region 202 and a first spacer 244 formed on the sidewalls of the second gate structure 240 are simultaneously obtained. After forming the patterned first protecting layer 220a and the first spacer 244, an etching process is performed to form recesses 250 in the substrate 200 respectively at two sides of the second gate structure 240. It is noteworthy that the patterned photoresist layer 216, the first spacer 244, the hard mask layer 212 on the second gate structure 240 all serve as an etching mask in the etching process. Consequently, the first spacer 244 and the hard mask 212 on the second gate structure 240 are consumed and lowered as shown in FIG. 5.

Figure 6:
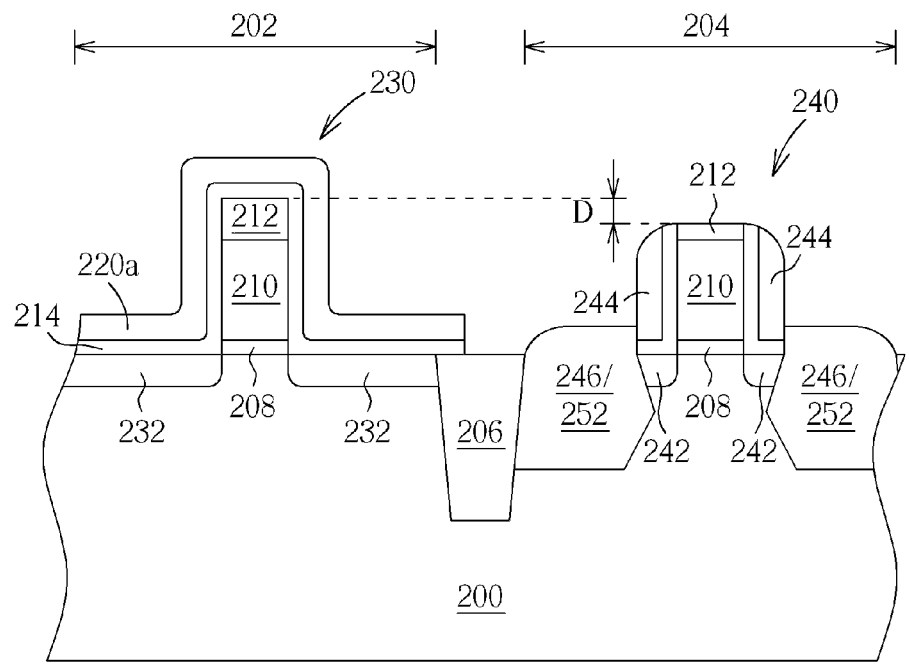

Please refer to FIG. 6. After the etching process, the patterned photoresist layer 216 is removed and a selective epitaxial growth (SEG) process is performed to form epitaxial silicon layers 252 respectively in each recess 250. As mentioned above, since the second type in this preferred embodiment is the P-type, the epitaxial silicon layer 252 comprises silicon germanium (SiGe). However, it is not limited to form the epitaxial silicon layer comprising silicon carbide (SiC) when the second type is the N-type. Furthermore, a dopant such as Boron (B) can be doped into the epitaxial silicon layers in situ with the SEG process. Therefore a second type source/drain 246 is obtained as shown in FIG. 6. As shown in FIG. 6, because the first spacer 244 is formed before forming the epitaxial silicon layer 252, at least at a portion of the first spacer 244 is covered by the epitaxial silicon layer 252. It is noteworthy that since the hard mask layer 212 is consumed in the etching process for forming the recesses 250, a height deviation D is consequently caused as shown in FIG. 6.

In addition, the recesses 250 are formed to have a plurality of slanted sidewalls as shown in FIG. 5, therefore the epitaxial silicon layers 252 grown along the slanted sidewalls obtain slanted sidewalls. Accordingly, the compressive or tensile stress generated on either side of the gate channel (not shown) caused by filling the epitaxial silicon layer 252 will increase the electrical or hole mobility of the gate channel.

Figure 7:
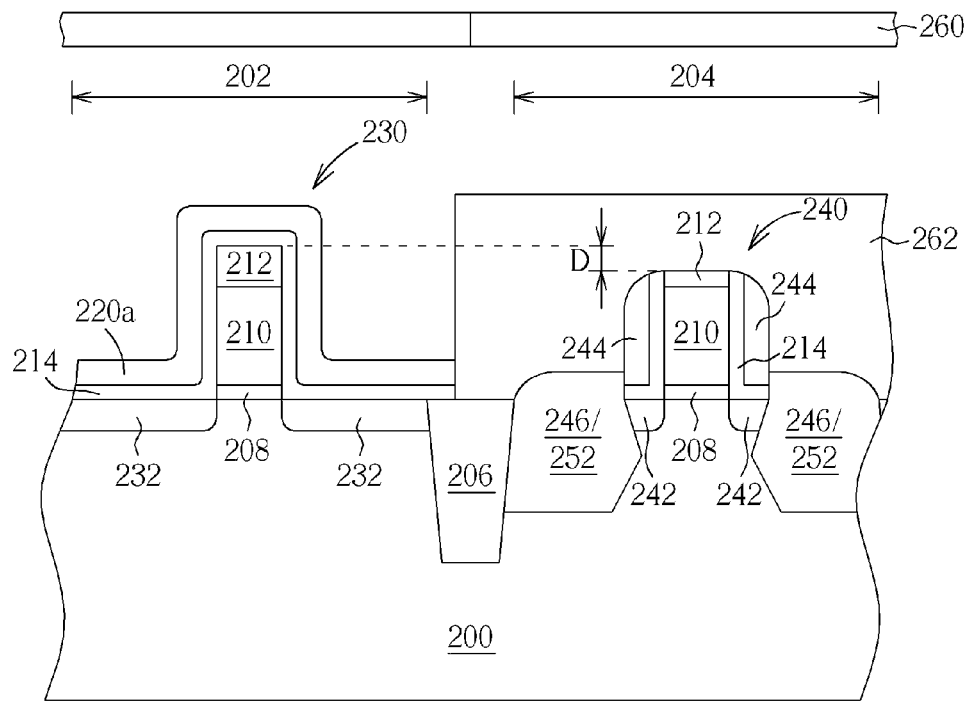

Please refer to FIG. 7. Next, a second protecting layer (not shown) is formed on the substrate 200. The second protecting layer is preferably a photoresist. However, it is not limited to form the second protecting layer including materials having etching rate different from the patterned first protecting layer 220a and the hard mask layer 212. Then, the second protecting layer is patterned by a photomask 260, thus a patterned second protecting layer 262 covering the second region 204 is obtained.

Figure 8:
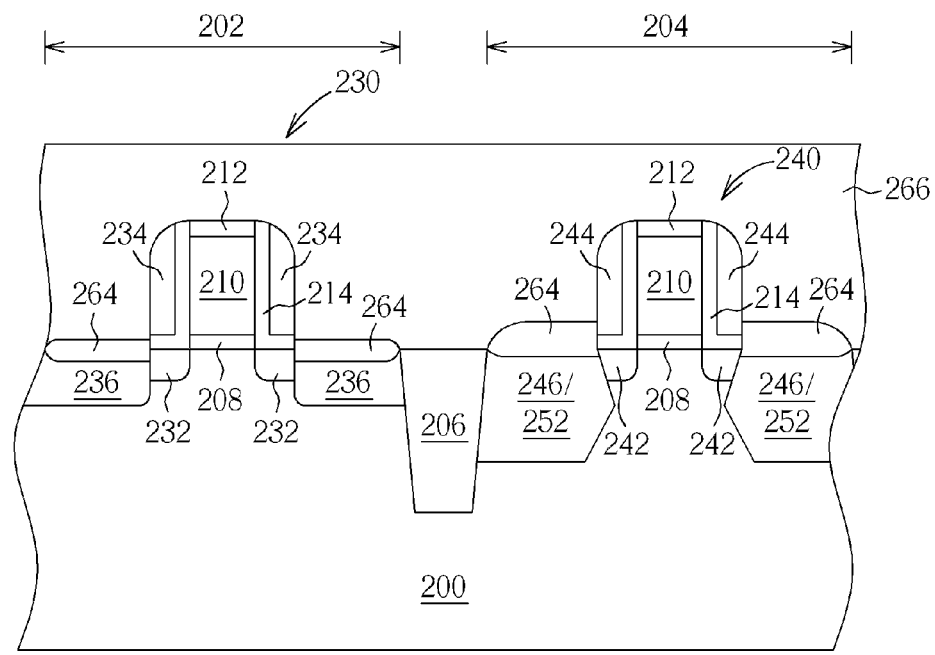

Please refer to FIGS. 7-8. Then, a dry etching process is performed with the patterned second protecting layer 262 serving as an etching mask to etch back the patterned first protecting layer 220a to form a second spacer 234 on sidewalls of the first gate structure 230 and to thin down the hard mask layer 212 on the first gate structure 230. It is noteworthy that the hard mask layer 212 on the first gate structure 230 is thinned down, which means the height deviations D is eliminated by the dry etching process. Accordingly, the first gate structure 230 and the second gate structure 240 are co-planar after the dry etching process. Furthermore, the second spacer 234 is formed identical to the first spacer 244. Then, an ion implantation is performed to form a first type source/drain 236 with the patterned second protecting layer 262 serving as an implant mask.

Please still refer to FIG. 8. Then, the patterned second protecting layer 262 is removed and followed by performing a self-aligned silicide (salicide) process to form salicide layers 264 respectively on the first type source/drain 236 and the epitaxial silicon layers 252. It is noteworthy that since the gate structure 230 and 240 are still protected by the hard mask layers 212, the salicide layers 264 are not formed on the gate structures 230 and 240. After forming the salicide layers 264, an interlayer dielectric (ILD) layer 266 is formed on the substrate 200. The ILD layer 266 can comprise silicon oxide, doped silicon oxide, phosphosilicate glass (PSG), or borophosphosilicate glass (BPSG). After forming the ILD layer 266, a contact hole etch stop (CESL) layer (not shown) is selectively formed on the substrate 200. The CESL layer can serve as the selective strain scheme by providing a stress generated by treating with heat or UV light in this preferred embodiment. As shown in FIG. 8, since there is no height deviation between the two gate structures 230 and 240, there is no seam left in the ILD layer 266, either.

Figure 9:
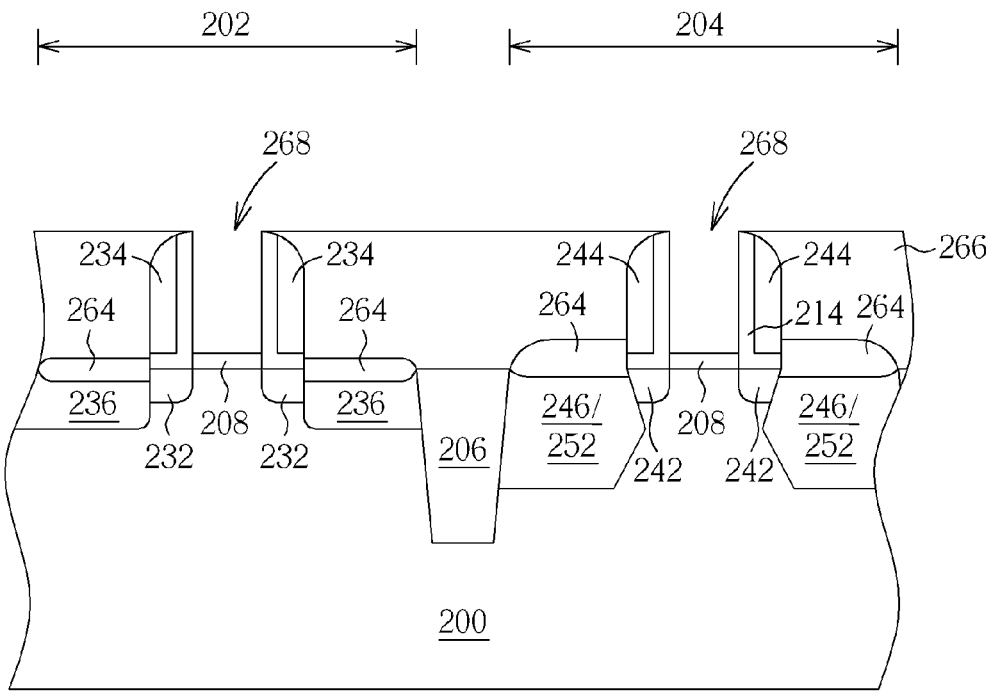

Please refer to FIG. 9. After forming the ILD layer 266, a planarization process such as a CMP process is performed to remove a portion of the ILD layer 266 and the hard mask layer 212 on both of the sacrificial layer 210 of the first and second gate structures 230 and 240. Therefore the sacrificial layers 210 are exposed. Then, the sacrificial layers 210 are removed, thus second recesses 268 are respectively formed in the first region 202 and the second region 204.

Figure 10:
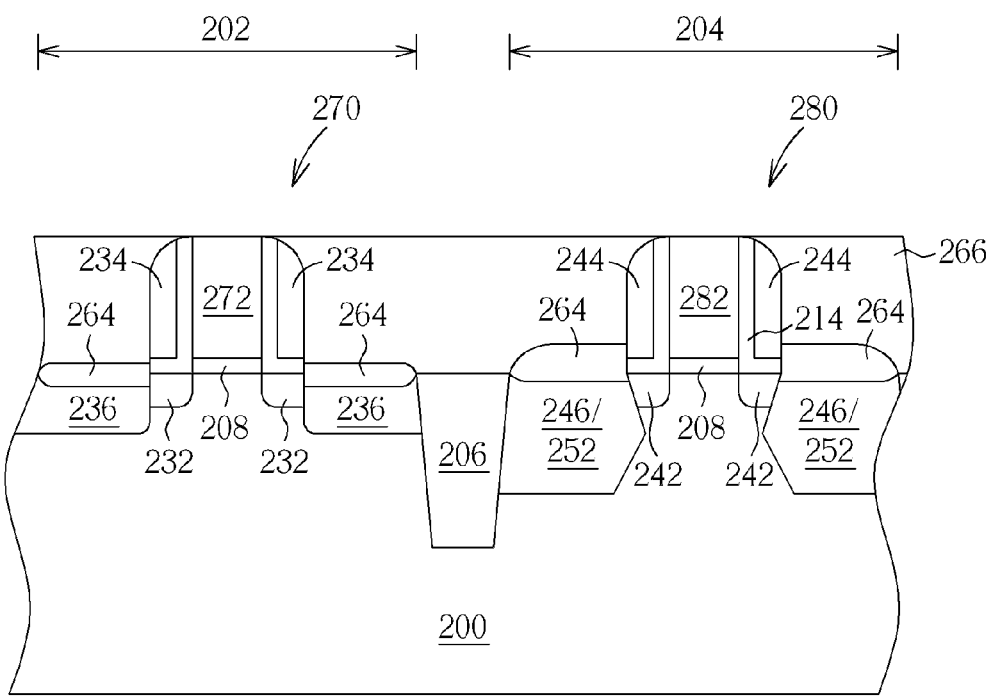

Please refer to FIG. 10. Then, a first type metal gate 272 and a second type metal gate 282 are respectively formed in the second recesses 268 in the first region 202 and the second region 204. The first type metal gate 272 and the second type metal 282 can be a dual metal gates. Because the materials used in the dual metal gate approach are well-known to those skilled in the art, those details and material choices are omitted in the interest of brevity.

Accordingly, a first type MOS transistor, that is an N-type MOS transistor 270 according to the preferred embodiment, is obtained in the first region 202; and a second type MOS transistor, that is a P-type MOS transistor 280 according to the preferred embodiment, is obtained in the second region 204. The N-type MOS transistor 270 includes the N-type metal gate 272 formed on the substrate 200, the N-type LDDs 232 formed in the substrate 200, the N-type source/drain 236 formed in the substrate 200 at two sides of the N-type metal gate 272 and the second spacer 234 formed on the sidewalls of the N-type metal gate 272. The P-type MOS transistor 280 includes the P-type metal gate 282 formed on the substrate 200, the P-type LDDs 242 formed in the substrate 200, the epitaxial silicon layers 252 serving as the P-type source/drain 246 formed in the substrate 200 respectively at two sides of the P-type metal gate 282 and the first spacer 244 identical to the second spacer 234 formed on sidewalls of the P-type metal gate 282. As shown in FIG. 10, tops of the N-type MOS transistor 270 and the P-type transistor 280 are co-planar.

According to the method of manufacturing a CMOS device provided by the present invention, the hard mask layer is thinned down after the SEG process, therefore no height deviation occurs between the two transistors. Consequently, the adverse impacts to the spacer and source/drain profiles and to the following ILD layer formation and planarization process are all prevented. Furthermore, the identical spacers are both formed by etching back the first protecting layer, thus no exceed consumption or damage occurs on the hard mask layer. Accordingly, no salicide layer is formed on the polysilicon layer and the removal of the sacrificial layer for forming the metal gate is performed completely and easily.

Those skilled in the art will readily observe that numerous modifications and alterations of the device and method may be made while retaining the teachings of the invention.

What is claimed is:

1. A method of manufacturing a complementary metal oxide semiconductor (CMOS) device comprising steps of:
   providing a substrate having a first region and a second region defined thereon;
   forming a first gate structure and a second gate structure respectively in the first region and the second region, each of the gate structures comprising a gate dielectric layer, a sacrificial layer, and a hard mask layer;
   forming a patterned first protecting layer covering the first region and a first spacer on sidewalls of the second gate structure;
   performing an etching process to form first recesses in the substrate at two sides of the second gate structure;
   performing a selective epitaxial growth (SEG) process to form epitaxial silicon layers in each first recess;
   forming a patterned second protecting layer to cover the entire second region and expose the entire first region; and
   performing a dry etching process with the patterned second protecting layer serving as an etching mask to etch back the patterned first protecting layer in the first region to form a second spacer on sidewalls of the first gate structure and to thin down the hard mask layer on the first gate structure, and the first spacer in the second region and the hard mask layer on the second gate structure being protected from the dry etching process by the second patterned protecting layer.

2. The method of claim 1 further comprising a step of forming first type lightly-doped drains (LDDs) in the substrate and second type LDDs in the substrate.

3. The method of claim 2 further comprising a step of forming a seal layer on the substrate before forming the first type LDDs and the second type LDDs.

4. The method of claim 1, wherein the step of forming a patterned first protecting layer and the first spacer further comprises:
   forming a first protecting layer on the substrate; and
   patterning the first protecting layer to form the patterned first protecting layer covering the first region and the first spacer on the sidewalls of the second gate structure.

5. The method of claim 4, wherein the hard mask layer and the first protecting layer comprise a same material.

6. The method of claim 5, wherein the same material comprises SiO, SiN, SiON, SiCN, SiC, SiOC, or silicon-rich-nitride (SRN).

7. The method of claim 1, wherein a height deviation is formed between the first gate structure and the second gate structure after the etching process.

8. The method of claim 7, wherein the drying etching process is performed to eliminate the height deviation.

9. The method of claim 1, wherein at least a dopant is doped into the epitaxial silicon layers in situ with the SEG process to form a second type source/drain.

10. The method of claim 1, further comprising a step of performing an ion implantation to form a first type source/drain with the patterned second protecting layer serving as an implant mask.

11. The method of claim 10, further comprising steps of:
   performing a self-aligned silicide (salicide) process to form salicide layers respectively on the first type source/drain and the epitaxial silicon layers; and
   forming an interlayer dielectric (ILD) layer on the substrate.

12. The method of claim 11, further comprising steps of:
   performing a planarization process to remove a portion of the ILD layer and the hard mask layer;
   removing the sacrificial layer to form second recesses respectively in the first region and the second region; and
   forming a first type metal gate and a second type metal gate respectively in the second recesses in the first region and the second region.

* * * * *